United States Patent [19]

Hwang et al.

[11] Patent Number: 5,273,823

[45] Date of Patent: * Dec. 28, 1993

[54] SHAPED ARTICLES CONTAINING COPOLYMERS OF POLYBENZAZOLES

[75] Inventors: Wen-Fang Hwang, Midland; Otto C. Raspor, Saginaw; William J. Harris; Thuan P. Dixit, both of Midland, all of Mich.

[73] Assignee: The Dow Chemical Company, Midland, Mich.

[ * ] Notice: The portion of the term of this patent subsequent to Jul. 9, 2008 has been disclaimed.

[21] Appl. No.: 547,650

[22] Filed: Jul. 2, 1990

Related U.S. Application Data

[63] Continuation-in-part of Ser. No. 407,973, Sep. 15, 1989, Pat. No. 5,151,489, which is a continuation-in-part of Ser. No. 327,925, Mar. 23, 1989, Pat. No. 5,030,706, which is a continuation-in-part of Ser. No. 256,338, Oct. 12, 1988, Pat. No. 5,089,568.

[51] Int. Cl.$^5$ .................................................. B32B 5/16
[52] U.S. Cl. ............................ 428/402; 264/331.12; 264/DIG. 42; 264/DIG. 61; 524/517; 525/419; 525/420; 525/432; 525/534
[58] Field of Search ............ 528/517, 423, 176, 327.1, 528/348, 183–189; 524/417; 525/432, 419, 420, 534; 264/331.12, DIG. 42, DIG. 61

[56] References Cited

U.S. PATENT DOCUMENTS

| | | | |
|---|---|---|---|
| 4,207,407 | 6/1980 | Helminiak et al. | 525/425 |
| 4,377,546 | 3/1983 | Helminak et al. | 264/232 |
| 4,533,693 | 8/1985 | Wolfe et al. | 524/417 |
| 4,816,554 | 3/1989 | Katritzksy et al. | 528/210 |
| 4,977,223 | 12/1990 | Arnold et al. | 525/432 |
| 5,041,506 | 8/1991 | Kumata et al. | 525/432 |
| 5,095,075 | 3/1992 | Arnold et al. | 525/432 |

FOREIGN PATENT DOCUMENTS 9003995 4/1990 PCT Int'l Appl. .

OTHER PUBLICATIONS

Harris et al., *Copolymers Containing Polybenzoxazole, Polybenzothiazole and Polybenzimidazole Moieties,* Ser. No. 407,973 (filed Sep. 15, 1989).

Harris et al., *Thermoplastic Compositions Containing Polybenzoxazole, Polybenzothiazole and Polybenzimidazole Moieties,* Ser. No. 327,926 (filed Mar. 23, 1989).

Hwang et al., *Shaped Articles Containing Copolymers of Polybenzazoles,* Ser. No. 562,781 (filed Aug. 6, 1990).

"Processing, Properties and Structure of Bulk Poly(-p-phenylene benzobisthiazole)/poly(ether ether ketone) Molecular Composites," The Materials Science & Engineering of Rigid Rod Polymers at 559 (Materials Research Soc. 1989).

*Primary Examiner*—Paul J. Thibodeau
*Assistant Examiner*—H. Thi Le

[57] ABSTRACT

Granular compositions which comprise a block copolymer containing blocks of polybenzazole polymer and blocks of thermoplastic polymer can be compression molded to provide a molded article having physical properties superior to molded articles made from the thermoplastic polymer alone.

66 Claims, No Drawings

SHAPED ARTICLES CONTAINING COPOLYMERS OF POLYBENZAZOLES

STATEMENT OF GOVERNMENT INTEREST

This invention was made with government support under Contract F33615-86-C-5068 awarded by the Department of the Air Force. The government has certain rights in this invention.

CROSS-REFERENCE TO COPENDING APPLICATION

This application is a continuation-in-part of copending application Ser. No. 407,973 (filed Sep. 15, 1989 now U.S. Pat. No. 5,151,489), which is a continuation-in-part of copending application 256,338 (filed Oct. 12, 1988 and now issued as U.S. Pat. No. 5,089,568).

BACKGROUND OF THE INVENTION

The present invention relates to the art of polybenzazole (PBZ) polymers and polymer compositions containing blocks of those polymers.

PBZ polymers, i.e., polybenzoxazole, polybenzothiazole and polybenzimidazole, and their synthesis are described in great detail in the following patents which are incorporated by reference: Wolfe et al., *Liquid Crystalline Polymer Compositions, Process and Products*, U.S. Pat. No. 4,703,103 (Oct. 27, 1987); Wolfe et al., *Liquid Crystalline Polymer Compositions, Process and Products*, U.S. Pat. No. 4,533,692 (Aug. 6, 1985); Wolfe et al., *Liquid Crystalline Poly(2,6-Benzothiazole) Compositions, Process and Products*, U.S. Pat. No. 4,533,724 (Aug. 6, 1985); Wolfe, *Liquid Crystalline Polymer Compositions, Process and Products*, U.S. Pat. No. 4,533,693 (Aug. 6, 1985); Evers, *Thermoxidatively Stable Articulated p-Benzobisoxazole and p-Benzobisthiazole Polymers*, U.S. Pat. No. 4,359,567 (Nov. 16, 1982); Tsai et al., *Method for Making Heterocyclic Block Copolymer*, U.S. Pat. No. 4,578,432 (Mar. 25, 1986) and 11 Ency. Poly. Sci. & Eng., *Polybenzothiazoles and Polybenzoxazoles*, 601 (J. Wiley & Sons 1988).

Polybenzazole polymers, and particularly "rigid rod" PBZ polymers, are noted for high tensile strength, high tensile modulus and high thermal stability. However, many polybenzazole polymers are difficult to fabricate into useful articles. Rigid and semi-rigid polybenzazoles do not have glass transition temperatures at any temperature at which they are stable. Therefore, the polymers are ordinarily spun from solution to form fibers, which serve as reinforcement within a thermosetting matrix, such as epoxy resins, to form composites. However, the fibers and the cured composites are not moldable or thermoformable.

Many moldable and thermoformable polymers are known. Exemplary polymers include thermoplastic polyamides, polyimides, polyquinolines, polyquinoxalines, poly(aromatic ether ketones) and poly(aromatic ether sulfones). However, those polymers do not have the high tensile strength and modulus which are characteristic of polybenzazole polymers.

Attempts have been made to synthesize articles which combine the processability of the thermoplastic polymer with the superior physical properties of the polybenzazole polymer. To this end, molecular composites of rigid rod polybenzazole and flexible polymers have been studied. Such molecular composites are described in numerous references, such as U.S. Pat. Nos. 4,207,407; 4,377,546; 4,631,318; 4,749,753 and 4,810,735, and Hwang et al., "Solution Processing and Properties of Molecular Composite Fibers and Films," 23 *Polymer Eng. & Sci.* 784 (1983); Hwang et al., "Phase Relationships of Rigid Rod Polymer/Flexible Coil Polymer/Solvent Ternary Systems," 23 *Polymer Eng. & Sci.* 789 (1983); and Hwang et al., "Composites on a Molecular Level: Phase Relationships, Processing and Properties," B22 *J. Macromol. Sci.-Phys.* 231 (1983), which are all incorporated herein by reference.

However, polybenzazole, and particularly rigid and semi-rigid polybenzazole, are incompatible with many thermoplastic polymers. When dopes containing polybenzazole and a thermoplastic polymer are coagulated, the polybenzazole agglomerates and/or phase separates. The resulting shaped articles either have poorer properties in all directions than the corresponding thermoplastic alone, or have superior properties in one direction and inferior properties in all other directions. Such compositions are useful for fibers, but not for molded articles.

What are needed are materials and processes which can be used to make molded articles containing reinforcing amounts of polybenzazole polymer which have superior properties in at least two dimensions and/or are not substantially phase separated.

SUMMARY OF THE INVENTION

One aspect of the present invention is a granular composition comprising a block copolymer having polybenzazole polymer blocks and thermoplastic polymer blocks of suitable size and proportion, such that the block copolymer is thermoplastic and can be compression molded without substantial phase separation, said granular composition having an average particle diameter of no more than about 1000$\mu$ (microns).

A second aspect of the present invention is a granular composition comprising a block copolymer having polybenzazole polymer blocks and thermoplastic polymer blocks of suitable size and proportion such that the block copolymer is flowable at a temperature below its decomposition temperature, wherein said granular composition has an average particle diameter of no more than about 1000$\mu$.

A third aspect of the present invention is a briquette containing a granular composition of the present invention.

A fourth aspect of the present invention is a process for forming a shaped article comprising the step of molding a granular composition of the present invention in a mold at a temperature at which the granular composition is flowable and a pressure sufficient to cause the granular composition to consolidate and conform to the shape of the mold.

A fifth aspect of the present invention is a molded article comprising a block copolymer having polybenzazole polymer blocks and thermoplastic polymer blocks, wherein said block copolymer is not substantially phase separated.

A sixth aspect of the present invention is a molded article comprising a block copolymer having polybenzazole polymer blocks and thermoplastic polymer blocks, wherein at least one physical property of the molded article, selected from the group consisting of the tensile strength, tensile modulus, flexural strength and flexural modulus, shows improvement in at least two dimensions over a molded article fashioned from the thermoplastic polymer alone.

A seventh aspect of the present invention is a molded article made by one of the processes of the present invention.

A eighth aspect of the present invention is a block copolymer comprising:
(a) at least one polybenzazole block containing on average at least about 5 mer units and less than 10 mer units; and
(b) at least one thermoplastic block linked to said polybenzazole block wherein the composition and proportions of the polybenzazole block and the thermoplastic block are chosen such that the block copolymer becomes flowable at a temperature at which it does not substantially decompose.

Granular compositions and/or briquettes of the present invention can be used in the process of the present invention to fabricate the molded articles of the present invention. Such molded articles may be useful as structural elements, as circuit boards, or for any other purpose for which molded plastic articles are useful.

DETAILED DESCRIPTION OF THE INVENTION

Definitions

The following terms, which are used repeatedly throughout this application, have the meanings and preferred embodiments set out hereinafter unless otherwise specified.

AA/BB-Polybenzazole (AA/BB-PBZ) - a polybenzazole polymer characterized by mer units having a first aromatic group ($Ar^1$), a first and a second azole ring fused with said first aromatic group, and a divalent linking moiety (DL) bonded by a single bond to the 2-carbon of the second azole ring. The divalent linking moiety (DL) is chosen such that does not interfere with the synthesis, fabrication or use of the PBZ polymer; it is preferably a second aromatic group ($Ar^2$). It may, in some cases, be an alkyl group or a bond. Mer units are preferably linked by a bond from the divalent linking group (DL) to the 2-carbon of the first azole ring in an adjacent mer unit. Mer units suitable for AA/BB-PBZ polymers are preferably represented by Formula 1: wherein Z is as defined for azole rings subsequently and all other characters have the meaning and preferred embodiments previously given.

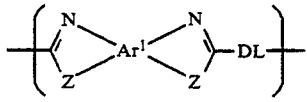

1

AB-Polybenzazole (AB-PBZ) - a polybenzazole polymer characterized by mer units having a first aromatic group and a single azole ring fused with said first aromatic group. The units are linked by a bond from the 2-carbon of the azole ring in one mer unit to the aromatic group of an adjacent mer unit. Mer units suitable for AB-PBZ polymers are preferably represented by Formula 2:

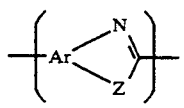

2 wherein Z is as defined for azole rings subsequently and all other characters have the meaning and preferred embodiments previously given.

Aromatic group (Ar) - any aromatic ring or ring system. Size is not critical as long as the aromatic group is not so big that it prevents further reactions of the moiety in which it is incorporated. Each aromatic group independently preferably comprises no more than about 18 carbon atoms, more preferably no more than about 12 carbon atoms and most preferably no more than about 6 carbon atoms. Each may be heterocyclic but is preferably carbocyclic and more preferably hydrocarbyl. If the aromatic group is heterocyclic, the heteroatom is preferably nitrogen.

Unless otherwise specified, each aromatic group may comprise a single aromatic ring, a fused ring system or an unfused ring system containing two or more aromatic moieties joined by bonds or by divalent moieties which are inert under polymerization conditions. Suitable divalent moieties comprise, for example, a carbonyl group, a sulfonyl group, an oxygen atom, a sulfur atom, an alkyl group and/or a perfluorinated alkyl group. Each aromatic group is preferably a single six-membered ring. When the aromatic group is an acylation reactive group, the divalent moiety may not contain deactivating groups, such as carbonyl or sulfonyl groups, unless they are sufficiently removed or decoupled from the reactive site for aromatic electrophilic substitution to occur.

Each aromatic group may contain substituents which are stable in solvent acid, do not interfere with further reactions of the moiety which the aromatic group is part of, and do not undergo undesirable side reactions. Examples of preferred substituents include halogens, alkoxy moieties or alkyl groups. More preferred substituents are either an alkyl group having no more than about 6 carbon atoms or a halogen. Most preferably, each aromatic group contains only those substituents specifically called for hereinafter.

Phase Separation - The existence within a coagulated article of optically distinct anisotropic domains of polymers. In shaped articles of the present invention, some phase-separation on a molecular level is inevitable, and the articles can show semicrystalline character. However, the size of domains of phase-separated polymer in the polymer compositions of the present invention is preferably on average not greater than about 1000 angstroms, highly preferably not greater than about 500 angstroms, more preferably not greater than about 200 angstroms, more highly preferably not greater than about 100 angstroms and most preferably not greater than about 50 angstroms. Phase separation may be judged by known characteristics, such as opacity, electron-microscopy, small-angle X-ray scattering or small-angle light scattering. Methods for measuring phase-separation in a system are discussed in Hwang et al., "Composites on a Molecular Level: Phase Relationships, Processing, and Properties," B22(2) J. Macromol. Sci.-Phys. 231, 234–35 (1983), which is incorporated by reference.

Polybenzazole (PBZ) polymer - A polymer from the group of polybenzoxazoles and polybenzobisoxazoles (PBO), polybenzothiazoles and polybenzobisthiazoles (PBT) and polybenzimidazoles or polybenzobisimidazoles (PBI). For the purposes of this application, the term "polybenzoxazole (PBO)" refers broadly to polymers in which each unit contains an oxazole ring bonded to an aromatic group, which need not necessarily be a benzene ring. The term "polybenzoxazole (PBO)" also refers broadly to poly(phenylene-benzobis-oxazole)s and other polymers wherein each unit comprises a plurality of oxazole rings fused to an aromatic group. The same understandings shall apply to the terms polybenzothiazole (PBT) and polybenzimidazole (PBI). Polybenzazole polymers used in the present invention are preferably polybenzoxazole or polybenzothiazole, and more preferably polybenzoxazole.

Rigid Rod PBZ polymer - An "intrinsic" or "articulated" rigid rod PBZ polymer as the terms "intrinsic" and "articulated" are defined in the Hwang, "Processing, Structure and Properties of Liquid Crystalline PBT Polymer," Kansai Committee of the Society of Fiber Science and Technology, Japan, Post Symposium on Formation, Structure and Properties of High Modulus and High Tenacity Fibers 23–26 (Aug. 26, 1985); Evers et al, "Articulated All-Para Polymers with 2,6-Benzobisoxazole, 2,6-Benzobisthiazole, and 2,6-Benzobisimidazole Units in the Backbone," 14 Macromolecules 925 (1981); Evers, "Thermoxidatively Stable Articulated Benzobisoxazole and Benzobisthiazole Polymers," 24 J. Poly. Sci. Part A 1863 (1986) and Evers et al., *Articulated Pars-Ordered Aromatic Heterocyclic Polymers Containing Diphenoxybenzene Structures*, U.S. Pat. No. 4,229,566 (Oct. 21, 1980).

Intrinsic rigid rod polymers are essentially rectilinear and are theorized to have a persistence length comparable to their contour length. They contain essentially no angles of catenation less than 150°. Articulated rigid rod polymers comprise a plurality of essentially rectilinear moieties joined by a relatively small number of moieties which are not rectilinear and have angles of catenation less than 150°. Rigid rod PBZ polymers used in the present invention are preferably intrinsic rigid rod polymers.

Solvent acid - any non-oxidizing liquid acid capable of dissolving PBZ polymers, such as sulfuric acid, methanesulfonic acid, trifluoromethylsulfonic acid, polyphosphoric acid and mixtures thereof, which is suitable for carrying out azole-ring formation or acylation or sulfonation reactions that form block copolymers used in the present invention. It must be sufficiently non-oxidizing that it does not substantially oxidize AB- and BB-PBZ monomers which are dissolved therein. Solvent acids are preferably dehydrating acids, such as polyphosphoric acid or a mixture of methanesulfonic acid and phosphorus pentoxide and/or polyphosphoric acid. Polyphosphoric acid preferably has a $P_2O_5$ content by weight of at least about 75 percent, more preferably at least about 78 percent and preferably has a $P_2O_5$ content of at most about 90 percent, more preferably at most about 85 percent. The ratio of methanesulfonic acid to phosphorus pentoxide in mixtures of those compounds is preferably no more than about 20:1 by weight; and preferably no less than about 1:1, more preferably no less than about 5:1 by weight. However, certain solvent acids, such as trifluoromethanesulfonic acid, are suitable for carrying out acylation or sulfonation reactions even though they do not contain a dehydrating component, such as phosphorus pentoxide.

Description of the Invention

The present invention uses thermoplastic block copolymers containing blocks of polybenzazole polymer and blocks of thermoplastic polymer. Some suitable block copolymers and processes to make them are described in detail in Harris et al., Copolymers Containing Polybenzoxazole, Polybenzothiazole and Polybenzimidazole Moieties, International Application No. PCT/US89/04464 (filed Oct. 6, 1989), International Publication No. WO 90/03995 (published Apr. 19, 1990) and in U.S. patent application Ser. No. 407,973 (filed Sep. 15, 1989), which are incorporated herein by reference.

The polybenzazole block may contain AB-PBZ mer units or AA/BB-PBZ mer units or both. It preferably contains AA/BB-PBZ mer units and more preferably consists essentially of AA/BB-PBZ mer units. The polybenzazole block may be rigid or non-rigid. It is preferably a rigid rod block. The polybenzazole block may contain polybenzoxazole, polybenzothiazole, and/or polybenzimidazole mer units. It preferably consists essentially of polybenzoxazole and/or polybenzothiazole mer units. It more preferably consists essentially of polybenzoxazole mer units.

Each polybenzazole block contains on average at least about 5 mer units and preferably at least about 8 mer units. Each polybenzazole block preferably contains on average at most about 150 mer units, more preferably at most about 100 mer units, and most preferably at most about 50 mer units. Theoretically, block copolymers having larger rigid or semi-rigid polybenzazole blocks, such as at least about 10–20 mer units on average, should ordinarily have higher tensile strength and modulus than polymers having smaller average rod lengths, such as about 5–10 mer units. However, the block copolymers containing smaller polybenzazole segments are frequently more flowable and easier to obtain complete consolidation under molding conditions. Thus, the molded article made from block copolymer having a smaller average rod length may have better physical properties under particular molding conditions.

The thermoplastic block may be any thermoplastic polymer or copolymer which can be synthesized into a block copolymer with the polybenzazole block and which is stable in a solvent acid. The thermoplastic polymer is preferably a polyamide, a polyimide, a polyquinoxaline, a polyquinoline, a poly(aromatic ether ketone) and/or a poly(aromatic ether sulfone), or a copolymer of those polymers with each other and/or polybenzazole. The thermoplastic block more preferably consists essentially of polyamide, poly(aromatic ether ketone) or poly(aromatic ether sulfone) or a copolymer with each other and/or polybenzazole. The thermoplastic block most preferably consists essentially of polyamide; poly(aromatic ether ketone) or poly(aromatic ether sulfone); or a copolymer of polybenzazole and poly(aromatic ether ketone) or poly(aromatic ether sulfone). Suitable thermoplastic blocks are described in Ser. No. 378,360 (filed Jul. 7, 1989) and in International Publication No. WO 90/03995 (published Apr. 9, 1990) at pp. 73–102, which are incorporated herein by reference. The thermoplastic blocks preferably have an average formula weight of at least about 800. Their degree of polymerization is preferably at least about 10 and more preferably at least about 20.

The proportion of polybenzazole block to thermoplastic block are chosen so that the entire block copolymer is thermoplastic. The block copolymer may contain between about 1 percent and about 99 percent thermoplastic block by weight. It preferably contains at least about 10 percent thermoplastic block by weight, more preferably contains at least about 30 percent thermoplastic block by weight, and most preferably contains at least about 70 percent thermoplastic block by weight. It preferably contains at least about 3 percent polybenzazole block by weight and more preferably contains at least about 5 percent polybenzazole block by weight. The block copolymer should become flowable at a temperature at which it does not substantially decompose.

Block copolymers containing higher proportions of rigid or semirigid polybenzazole may frequently provide superior physical properties as fabricated, but block copolymers containing lower proportions of polybenzazole may be more flowable and thus may consolidate better to provide a molded article having superior properties. The proportions of polybenzazole block to thermoplastic block are preferably chosen such that the block copolymer flows and the granular composition consolidates during molding to provide a molded article having physical properties superior to molded articles made from the thermoplastic homopolymer alone. Those optimum proportions varies depending upon the specific polymers and block sizes used in the block copolymer, but can readily be determined experimentally by persons of ordinary skill in the art.

The average molecular weight of the block copolymer as a whole also affects the flowability of the block copolymer. The average molecular weight should be kept low enough that the granular composition consolidates during molding to provide a molded article having physical properties superior to molded articles made from the thermoplastic homopolymer alone. Molecular weight may be regulated either by adjusting the stoichiometry of the reaction or by use of a chain terminator. Many different monofunctional reagents may be used as chain terminators, as described in U.S. Pat. No. 4,703,103, which is incorporated herein by reference, but monofunctional aromatic carboxylic acid derivatives such as benzoic acid and benzoyl chloride are preferred. The optimum average molecular weight varies depending upon the specific polymers, block sizes and proportions of blocks used in the block copolymer, but can readily be determined experimentally by persons of ordinary skill in the art.

Compositions and molded articles of the present invention may consist essentially of a block copolymer as previously described. Alternatively, compositions and molded articles of the present invention may contain thermoplastic polymers or polybenzazole polymers which are not part of a block copolymer, or both. The polymers are preferably selected such that the physical properties of the molded composition are superior to physical properties of the thermoplastic polymer alone, in at least two dimensions. The polymers are more preferably selected such that the composition does not experience substantial phase separation during coagulation or molding. If the composition contains a thermoplastic polymer, it is preferably a homopolymer or copolymer having a structure similar to the thermoplastic blocks of the block copolymer. The concentration of polybenzazole polymer in the composition should be low enough that the composition is moldable. The proportions of polybenzazole outside of block copolymers are preferably minimized and more preferably about 0 percent by weight.

The block copolymers and polymer compositions containing them are ordinarily formed in a solvent acid solution or dope, from which they may be coagulated by contacting the dope with a non-solvent diluent such as water. The dope must ordinarily be in an optically isotropic (non-liquid crystalline) state when coagulated in order to form a coagulated product which is at least substantially planar isotropic (isotropic in two dimensions) and is more preferably isotropic in three dimensions. The coagulated product is most preferably not substantially phase separated. Liquid crystalline dopes tend to form phase separated and anisotropic coagulated products.

Optical isotropy and anisotropy of the dope can be determined by a number of tests familiar to persons of ordinary skill in the art, such as those described in Hwang et al., "Composites on a Molecular Level: Phase Relationships, Processing, and Properties," B22(2) J. Macromol. Sci.-Phys. 231, 234–35 (1983), which is incorporated by reference. A simple method is to see if the solution exhibits birefringence when viewed under a microscope under cross-polar conditions. Within even optically isotropic solutions, some association of rigid rod blocks is inevitable on a molecular scale. However, in polymers precipitated from the optically isotropic phase, the level of anisotropy and phase-separation is preferably small enough to provide a block copolymer or polymer composition which is essentially a molecular composite.

The point at which a given dope changes from optically isotropic to anisotropic phase and the reverse varies as a function of many factors, such as the concentration of the polymer, the solvent, the size and concentration of rigid rod PBZ blocks within the polymers in the dope, the temperature of the dope and other factors. The parameter most easily controlled is concentration of the block polymer and any homopolymer. It is convenient to synthesize the block copolymer in a solution having a low enough concentration to avoid the anisotropic phase. If an anisotropic dope is formed, it may be diluted with solvent acid until an optically isotropic state is reached.

The preferred concentration of polymer in optically isotropic dopes of the present invention varies depending upon the portion of the polymer which is rigid rod PBZ. If the polymer in the dope contains only about 5 weight percent rigid rod PBZ block or less, then the concentration of polymer in the dope may be as high as the solvent acid can dissolve, such as about 50 weight percent or less. If the polymer contains about 30 weight percent rigid rod PBZ block, then the dope preferably comprises no more than about 15 weight percent polymer. If the polymer contains about 50 weight percent rigid rod PBZ block, then the dope preferably comprises no more than about 10 weight percent polymer. If the polymer comprises about 70 weight percent rigid rod PBZ block, then the dope preferably comprises no more than about 6 weight percent polymer and more preferably no more than about 4 weight percent polymer.

The solvent acid in the dope has the definition and preferred embodiment previously given for solvent acids. It is most conveniently the solvent acid in which the block copolymer was synthesized. However, the block copolymer may be synthesized in a first solvent acid such as polyphosphoric acid, coagulated, and redissolved in a second solvent acid such as methanesulfonic acid.

The dope may also contain other additives that precipitate with the polymers, such as stabilizers or coloring agents. Preferably, such additives are minimized.

The polymer is recovered from the dope by contacting the dope with a non-solvent which causes the block copolymer to coagulate. The non-solvent is preferably aqueous. The non-solvent may be basic or slightly acidic, but is preferably about neutral at the commencement of its use. Of course, the non-solvent bath may become progressively more acidic as it coagulates more dope unless the non-solvent in the bath has a reasonably steady flow of non-solvent to and from the bath or a pH adjusting material is added.

Large coagulated particles of block copolymers and compositions containing them may be difficult to grind or pulverize to make granular compositions of the present invention. Therefore, it is preferable to coagulate the dope directly in a granular form. This can be carried out by a number of processes.

For instance, the dope may be frozen. The dope is preferably frozen at a temperature less than 0° C., more preferably at most about −78° C., more highly preferably at most about −150° C. and most preferably at most about −190° C. A convenient temperature is liquid nitrogen temperature. The frozen dope is more easily ground than is the coagulated polymer and may be ground on ordinary grinding equipment suitable for grinding the frozen solvent acid, such as a ball mill or attrition mill. The ground dope is then placed in a relatively warmer non-solvent bath, which causes the dope to melt and the polymer to coagulate. The bath must be at a temperature above the freezing point of the dope. It is preferably at a temperature of at least about 10° C., and is more preferably at a temperature no higher than about 50° C. The temperature is conveniently room temperature. Freeze-grinding and apparatuses to carry it out are described in the following U.S. Pat. Nos. 2,216,094; 2,836,368; 3,453,221; 3,868,997; 4,069,161; 3,936,517; 3,614,001; 3,658,259; 3,713,592; 3,771,729; 4,072,026; and 4,273,294, which are incorporated herein by reference.

Alternatively, the dope may be sprayed in a fine mist into a coagulation bath. The coagulation bath is preferably agitated or otherwise in motion. The powders resulting from either method are preferably filtered, washed, and dried in order to recover the granular composition. Spray extraction of polymers and equipment for carrying it out are described in the following U.S. Pat. Nos. 3,953,401; 4,100,236; 4,206,161 and 4,469,818; which are incorporated herein by reference.

The resulting granular product should have an average particle size small enough to be molded into a solid article. The average particle diameter is preferably no more than about 500$\mu$, more preferably no more than about 100$\mu$, more highly preferably no more than about 50$\mu$, and most preferably, no more than about 10$\mu$.

The particles are preferably homogeneous, having approximately the same mixtures and proportions of polymers as were found in the dope. Polymer within the particles is preferably isotropic in at least two dimensions (planar isotropic), and is more preferably isotropic in three dimensions.

Granular compositions of the present invention may be molded as they are, but they are conveniently pressed to form a briquette for easier handling. The briquette is formed by subjecting the powder to a pressure high enough to press it together so that it will not fall apart again when pressure is released. The pressure is preferably at least about 50 psi, more preferably at least about 500 psi, and most preferably at least about 2000 psi. The preferred size of the briquette is limited primarily by practical considerations. It must be of an appropriate size for the mold in which it will be used. If it is too large there may be difficulty in pressing a single briquette from the powder.

The granular composition of the present invention, whether in granular or briquette form, may be molded by heating under pressure in a mold. The molding process takes place in a mold, which may be as simple as two heated platens for making a flat plaque or may be complex, such as the shape of a part, etc. The granular composition may be molded in the mold alone, or fibers may be intermixed with the granular composition such that the resulting molded product is a fiber reinforced composite. Examples of suitable fibers include aramid fibers, carbon fibers, glass fibers, ceramic fibers, quartz fibers and polybenzazole fibers. The granular composition may also be molded in a mixture with granular additives, such as stabilizers, fillers, coloring agents, rubber modifiers or other additives.

The temperature and pressure of molding are chosen so that the individual particles of the granular composition fuse to form a single article. Optimum temperature, pressure and time of molding necessarily depend upon the flowability of the polymers in the granular composition. Copolymers that contain longer rigid or semi-rigid segments, contain higher concentrations of rigid and semi-rigid segments and have higher average molecular weights ordinarily require higher molding temperatures and pressures and longer molding times than similar copolymers that contain shorter rigid or semi-rigid segments, contain lower concentrations of rigid and semi-rigid segments and/or have lower average molecular weights.

The temperature should be at least about the glass transition temperature of the granular composition. It is preferably at least about 5 to 100° C. above the glass transition temperature of the granular composition. It should also be below the temperature at which substantial decomposition occurs in the granular composition. The preferred temperatures are highly dependent upon the chemical and physical make-up of the granular composition. For block copolymers having no more than about 25 percent rigid rod cis-polybenzoxazole polymer block and no less than about 75 percent of either poly(aromatic ether ketone) block or polybenzoxazole/poly(aromatic ether ketone) block, the temperature is preferably at least about 250° C., more preferably at least about 325° C. and most preferably at least about 350° C. For block copolymers having no more than about 25 percent rigid rod cis-polybenzoxazole polymer block and no less than about 75 percent of amorphous polyamide block, the temperature is preferably at least about 100° C. and more preferably at least about 150° C. Optimum temperatures for each granular composition may be determined without undue experimentation by persons of ordinary skill in the art.

The pressure may be any pressure at which individual particles in the granular composition will fuse and consolidate to form a single article. Preferred pressure is also dependent upon the physical and chemical make-up of the granular composition and upon the temperature at which molding occurs. The pressure is preferably as low as is necessary to obtain sufficient consolidation of the powder to make a molded product. For block copolymers containing no more than about 25 percent rigid rod cis-polybenzoxazole and at least about 75 percent of either poly(aromatic ether ketone) block or polybenzoxazole/poly(aromatic ether ketone) block or amorphous polyamide block, the pressure is preferably no more than about 50,000 psi, more preferably no more than about 10,000 psi and most preferably no more than about 5000 psi. To obtain good consolidation the pressure is ordinarily at least about 50 psi, more typically at least about 500 psi and most often at least about 1000 psi. Optimum pressure may be determined by persons of ordinary skill in the art without undue experimentation.

The molded article may optionally be annealed after it is molded. The annealing preferably takes place at a temperature above the glass transition temperature of the polymer in the molded article, but below its melting point. Annealing more preferably takes place at a temperature close to the melting point of the polymer. Annealing may take place at subatmospheric or supratmospheric pressures, but is conveniently at about ambient temperature. The atmosphere for annealing is preferably air or nitrogen, but may be any other atmosphere in which the polymer is essentially stable under annealing conditions. Annealing typically causes an increase in the tensile strength of the molded article, but may also cause a slight decrease in the tensile modulus of the molded article.

The product of the molding process is a molded article containing the block copolymers previously described, wherein the granules of the granular composition are fused together. The fusion of individual particles may be less than perfect and complete, but the molded article is preferably essentially void free. The polymer in the molded article is preferably at least substantially planar isotropic and more preferably substantially isotropic in all dimensions. The molded article may exhibit some crystalline zones.

The molded article preferably has physical properties which are superior to the physical properties of similar molded articles that contain only polymers similar to the thermoplastic block of the block copolymer. For instance, the molded article may have higher tensile strength, tensile modulus, flexural modulus, flexural strength, dimensional stability and/or solvent resistance. The improvement in properties is preferably exhibited in at least two perpendicular dimensions and more preferably in all directions. In other words, the improvement is at least biaxial, rather than uniaxial. The improvement in properties need not be uniform in all directions, but it preferably is about uniform.

The molded article is preferably not substantially phase separated. It is not a fiber. It preferably has a thickness of 10 mil, and more preferably at least about ⅛ inch. The maximum thickness is limited primarily by practical considerations, such as scale of equipment and the ability to heat the sample to a proper temperature throughout. It may be used as a structural material or as an electronic substrate or for any other use in which a thermoplastic polymer corresponding to the thermoplastic portion of the block copolymer would have been suitable.

ILLUSTRATIVE EXAMPLES

The following examples are given to illustrate the invention and should not be interpreted as limiting it in any way. Unless stated otherwise, all parts and percentages are given by weight.

EXAMPLE 1

Granular compositions containing (a) a block copolymer of 50 percent cis-polybenzoxazole and 50 percent amorphous polyamide, and (b) amorphous polyamide, and molded articles made from them Dopes are synthesized containing (a) a block copolymer of rigid rod cis-polybenzoxazole and amorphous polyamide; and (b) an amorphous polyamide polymer. The solvent acid of the dope is a mixture of methanesulfonic acid, polyphosphoric acid and phosphorus pentoxide.

The cis-polybenzoxazole blocks in the block copolymer have the calculated number average of mer units shown in Table 1 and the inherent viscosity (before incorporation into the block copolymer) shown in Table 1, as measured in methanesulfonic acid at 25° C. and 0.05 g/dL concentration. The amorphous polyamide blocks in the block copolymer are the product of reacting hexamethylene diamine with a mixture containing 30 percent terephthaloyl chloride and 70 percent isophthaloyl chloride and appropriate amounts of 4-phenoxyphenoxybenzoyl chloride.

The block copolymer is synthesized by (1) endcapping the polybenzoxazole block with decoupled carboxylic acid halide; (2) contacting it with polyamide that is end-capped with decoupled aromatic groups; and (3) reacting essentially equivalent moles and weights of the end-capped polymers in dehydrating solvent acid under conditions such that aromatic electrophilic substitution occurs. The process is described in detail in Harris et al., Copolymers Containing Polybenzoxazole, Polybenzothiazole and Polybenzimidazole Moieties, International Application No. PCT/US89/04464 (filed Oct. 6, 1989), International Publication No. WO 90/03995 (published Apr. 19, 1990) and in U.S. patent application Ser. No. 407,973 (filed Sep. 15, 1989), which are incorporated herein by reference. The resulting block copolymer contains about 50 percent by weight cis-polybenzoxazole and about 50 percent by weight amorphous polyamide, and has the inherent viscosity shown in Table 1, as measured in methanesulfonic acid at 25° C. and 0.05 g/dL concentration.

An amorphous polyamide sold under the trademark of Selar-PA ™ by E. I. DuPont de Nemours & Co. is added to each dope until the total weight proportions of polybenzoxazole to polyamide in each dope (counting both polyamide in the block copolymer and polyamide not in the block copolymer) is about 15 percent polybenzoxazole to 85 percent amorphous polyamide. The resulting dopes are optically isotropic (not liquid crystalline). The total concentration of amorphous polyamide and block copolymer in the dope is 4 weight percent.

Each dope is frozen at a temperature between −190° C. and −200° C., and ground to a particle size distribution between about 10μ and 2000μ. The ground frozen dopes are added to an agitated water bath at about room temperature. The resulting precipitated granular compositions are filtered, washed and dried. They have a particle size distribution between about 1μ and about 250μ.

About 6 grams of each powder is pressed under 20,000 psi pressure at room temperature for about 10 seconds to form a briquette.

Each briquette is molded at the temperature and pressure shown in Table 1 for the time shown in Table 1 to form a disk having a thickness of about 1/16-inch (0.16 cm) and a diameter of about 2½-inches (6.4 cm). Each disk is tested for flexural strength and modulus by the test described in ASTM D-790. It has the strength, modulus and strain shown in Table 1.

TABLE 1

| Sample | PBO Avg. Mer Units | PBO I.V. (dL/g) | Copolymer I.V. (dL/g) | Molding Temp (°C.) | Molding Press (psi)[1] | Molding Time (min) | Flex Modulus (ksi)[1] | Flex Strength (ksi)[1] | Flex Strain (%) |
|---|---|---|---|---|---|---|---|---|---|
| 1 | 13 | * | 6.2 | 190 | 5 | 3 | 700 | 13.4 | 1.9 |
| 2 | 13 | * | 6.2 | 200 | 5 | 3 | 696 | 13.7 | 2.0 |
| 3 | 13 | * | 6.2 | 250 | 5 | 3 | 621 | 10.7 | 1.8 |
| 4 | 13 | * | 6.2 | 225 | 5 | 3 | 657 | 14.3 | 2.2 |
| 5 | 13 | * | 6.2 | 180 | 5 | 3 | 723 | 13.0 | 1.8 |
| 6 | 13 | * | 6.2 | 180 | 5 | 300 | 768 | 11.3 | 1.5 |
| 7 | 13 | * | 6.2 | 170 | 5 | 3 | 731 | 11.2 | 1.5 |
| 8 | 13 | * | 6.2 | 170 | 5 | 60 | 727 | 10.8 | 1.5 |
| 9 | 13 | * | 6.2 | 170 | 20 | 60 | 735 | 12.5 | 1.7 |
| 10 | 13 | * | 6.2 | 200 | 20 | 1 | 693 | 11.7 | 1.7 |
| 11 | 44 | 10.5 | 10.9 | 180 | 5 | 3 | 696 | 13.2 | 1.9 |
| 12 | 44 | 10.5 | 10.9 | 200 | 5 | 3 | 651 | 14.3 | 2.2 |
| 13 | 44 | 10.5 | 10.9 | 200 | 20 | 1 | 667 | 13.4 | 2.1 |
| 14 | 44 | 10.5 | 10.9 | 225 | 20 | 0.5 | 665 | 13.9 | 2.1 |

*not measured
[1] 1 ksi = 1,000 psi

EXAMPLE 2

Granular compositions containing a block copolymer of 10 percent cis-polybenzoxazole and 90 percent poly(aromatic ether ketone), and molded articles made from them Dopes are formed containing 10 weight percent cis-polybenzoxazole and 90 weight percent poly(aromatic ether ketone). The solvent acid of the dope is a mixture of methanesulfonic acid, polyphosphoric acid and phosphorus pentoxide.

The cis-polybenzoxazole blocks in the block copolymer have the calculated average number of mer units shown in Table 2 and the inherent viscosity (before incorporation into the block copolymer) shown in Table 2, as measured in methanesulfonic acid at 25° C. and 0.05 g/dL concentration. The poly(aromatic ether ketone) blocks in the block copolymer are the product of reacting oxy-bis-(4-benzoyl chloride) with 1,4-diphenoxybenzene.

The block copolymer is synthesized by (1) end-capping the polybenzoxazole block with decoupled carboxylic acid halide; (2) reacting the polybenzoxazole block terminated by a decoupled acid group with oxy-bis-(4-benzoyl chloride) and 1,4-diphenoxybenzene and benzoic acid (a terminator) under conditions such that aromatic electrophilic substitution occurs. The process is described in detail in Harris et al., Copolymers Containing Polybenzoxazole, Polybenzothiazole and Polybenzimidazole Moieties, International Application No. PCT/US89/04464 (filed Oct. 6, 1989), International Publication No. WO 90/03995 (published Apr. 19, 1990) and in U.S. patent application Ser. No. 407,973 (filed Sep. 15, 1989), which are incorporated herein by reference. The resulting block copolymer composition contains about 10 percent by weight cis-polybenzoxazole and about 90 percent by weight poly(aromatic ketone), and has the inherent viscosity shown in Table 2, as measured in methanesulfonic acid at 250° C. and 0.05 g/dL concentration. Its concentration in the dope is about 8 weight percent. The resulting dopes are optically isotropic (not liquid crystalline).

Each dope is frozen at a temperature between −190° C. and −200° C., and ground to a particle size distribution between about 10μ and 2000μ. The ground frozen dopes are added to an agitated water bath at about room temperature. The resulting precipitated granular compositions are filtered, washed and dried. Some granular compositions are also extracted with acetone or acetyl acetone. The granular compositions have a particle size distribution between about 1μ and 250μ.

About 6 grams of each powder is pressed under about 20,000 pressure at room temperature for about 10 seconds to form a briquette.

Each briquette is molded at the temperature and pressure shown in Table 2 for the time shown in Table 2 to form a disk having a thickness of about 1/16-inch (0.16 cm) and a diameter of about 2½-inches (6.4 cm). Each disk is tested for flexural strength and modulus by the test described in ASTM D-790. It has the strength, modulus and strain shown in Table 2.

TABLE 2

| Sample | PBO Mer Units | PBO I.V. (dL/g) | Percent Terminator[2] | Copolymer I.V. (dL/g) | Molding Temp (°C.) | Molding Pressure (ksi)[1] | Molding Time (min) | Flex Modulus (ksi) | Flex Strength (ksi) | Flex Strain (%) |
|---|---|---|---|---|---|---|---|---|---|---|
| 15 | 13 | * | 2 | 4.79 | 360 | 5 | 60 | 701 | 12.5 | 1.8 |
| 16 | 8 | * | 6 | 4.79 | 360 | 5 | 60 | 765 | 10.3 | 1.4 |
| 17 | 8 | * | 6 | 4.79 | 360 | 5 | 15 | 736 | 8.7 | 1.2 |
| 18 | 8 | * | 6 | 4.79 | 360 | 5 | 120 | 780 | 11.5 | 1.5 |
| 19 | 13 | * | 2 | 4.79 | 360 | 5 | 60 | 710 | 17.2 | 2.1 |
| 20 | 13 | * | 2 | 4.79 | 360 | 5 | 60 | 693 | 14.0 | 2.1 |
| 21 | 13 | * | 2 | 4.79 | 340 | 5 | 60 | 725 | 11.6 | 1.6 |
| 22 | 13 | * | 2 | 4.79 | 350 | 5 | 60 | 749 | 14.4 | 1.9 |
| 23 | 13 | * | 2 | 4.79 | 350 | 5 | 5 | 707 | 10.9 | 1.6 |
| 24 | 8 | * | 2 | 5.7 | 340 | 5 | 60 | 699 | 9.9 | 1.5 |
| 25 | 8 | * | 2 | 5.7 | 350 | 5 | 60 | 718 | 12.1 | 1.7 |
| 26 | 8 | * | 2 | 5.7 | 360 | 5 | 60 | 656 | 15.2 | 2.4 |
| 27 | 8 | * | 2 | 5.7 | 360 | 5 | 5 | 736 | 13.3 | 1.9 |
| 28 | 8 | * | 6 | 3.39 | 360 | 5 | 60 | 703 | 9.2 | 1.3 |
| 29 | 8 | * | 6 | 3.39 | 350 | 5 | 60 | 790 | 12.7 | 1.6 |
| 30 | 8 | * | 6 | 3.39 | 340 | 5 | 240 | 747 | 11.4 | 1.6 |

TABLE 2-continued

| Sample | PBO Mer Units | PBO I.V. (dL/g) | Percent Terminator[2] | Copolymer I.V. (dL/g) | Molding Temp (°C.) | Molding Pressure (ksi)[1] | Molding Time (min) | Flex Modulus (ksi) | Flex Strength (ksi) | Flex Strain (%) |
|---|---|---|---|---|---|---|---|---|---|---|
| 31 | 8 | * | 6 | 3.39 | 340 | 5 | 60 | 716 | 9.8 | 1.4 |
| 32 | 8 | * | 6 | 3.39 | 350 | 5 | 60 | 776 | 12.5 | 1.6 |
| 33 | 8 | * | 6 | 3.39 | 350 | 5 | 30 | 795 | 10.1 | 1.3 |
| 34 | 8 | * | 6 | 3.39 | 350 | 5 | 120 | 797 | 12.0 | 1.6 |
| 35 | 8 | * | 4 | 4.3 | 340 | 5 | 60 | 735 | 10.8 | 1.5 |
| 36 | 8 | * | 4 | 4.3 | 350 | 5 | 60 | 677 | 11.7 | 1.8 |
| 37 | 8 | * | 4 | 4.3 | 340 | 5 | 240 | 717 | 10.2 | 1.5 |
| 38 | 8 | * | 4 | 4.3 | 350 | 5 | 5 | 766 | 11.5 | 1.6 |
| 39 | 8 | * | 4 | 4.3 | 360 | 5 | 5 | 741 | 13.3 | 1.9 |
| 40 | 21 | 5.3 | 6 | * | 350 | 5 | 3 | 633 | 2.2 | 0.4 |
| 41 | 21 | 5.3 | 6 | * | 350 | 5 | 5 | 754 | 3.4 | 0.5 |
| 42 | 21 | 5.3 | 6 | * | 350 | 5 | 60 | 637 | 1.9 | 0.3 |
| 43 | 21 | 5.3 | 6 | * | 3 | 3 | 3 | 545 | 12.8 | 2.4 |
| 44 | 8 | 2.3 | 6 | 3.5 | 350 | 5 | 5 | 761 | 11.8 | 1.6 |
| 45 | 8 | 2.3 | 6 | 3.0 | 350 | 5 | 5 | 702 | 12.2 | 1.7 |
| 46 | 8 | 2.3 | 6 | * | 350 | 5 | 5 | 735 | 10.5 | 1.6 |
| 47 | 8 | 2.3 | 6 | * | 360 | 5 | 5 | 714 | 12.9 | 1.9 |
| 48[6] | 8 | 2.3 | 6 | * | 350 | 5 | 5 | 710 | 16.5 | 2.5 |
| 49[7] | 8 | 2.3 | 6 | * | 350 | 5 | 5 | 704 | 13.4 | 2.0 |
| 50[8] | 8 | 2.3 | 6 | * | 350 | 5 | 5 | 719 | 12.4 | 1.7 |
| 51[9] | 8 | 2.3 | 6 | * | 350 | 5 | 5 | 724 | 16.8 | 2.4 |
| 52[10] | 8 | 2.3 | 6 | * | 350 | 5 | 5 | 722 | 16.3 | 2.3 |
| 53[11] | 8 | 2.3 | 6 | * | 350 | 5 | 5 | 684 | 18.9 | 2.9 |
| 54 | 21 | 5.3 | 6 | * | 360 | 5 | 60 | 677 | 3.4 | 0.6 |

*not measured
[1] 1 ksi = 1000 psi
[2] terminator was benzoic acid, expressed as a mole percentage of diphenoxybenzene
[3] sintered at 350° C. for 1245 minutes
[6] annealed at 300° C. for 960 minutes in air after molding
[7] annealed at 300° C. for 240 minutes in air after molding
[8] annealed at 300° C. for 240 minutes in nitrogen after molding
[9] annealed at 340° C. for 240 minutes in air after molding
[10] annealed at 340° C. for 240 minutes in nitrogen after molding
[11] annealed at 340° C. for 960 minutes in air after molding

EXAMPLE 3

Granular compositions containing a block copolymer of cis-polybenzoxazole and a thermoplastic polybenzoxazole/poly(aromatic ether ketone) copolymer, and molded articles made from them Dopes are formed containing cis-polybenzoxazole and thermoplastic polybenzoxazole/poly(aromatic ether ketone) copolymer in the proportions shown in Table 3. The solvent acid of the dope is a mixture of methanesulfonic acid, polyphosphoric acid and phosphorus pentoxide.

The cis-polybenzoxazole blocks in the block copolymer have the calculated average number of mer units shown in Table 3 and the inherent viscosity (before incorporation into the block copolymer) shown in Table 3, as measured in methanesulfonic acid at 25° C. and 0.05 g/dL concentration. The polybenzoxazole/(aromatic ether ketone) blocks in the block copolymer are the product of reacting 4,6-diaminoresorcinol, oxy-bis-(4-benzoyl chloride) and 1,4-bis-(phenoxy)benzene in a molar ratio of about 1:2:1.

The block copolymer is synthesized by (1) reacting the polybenzoxazole oligomer and 4,6-diaminoresorcinol with 2 moles of oxy-bis-(4-benzoyl chloride) per mole of oligomer and 4,6-diaminoresorcinol combined; (2) reacting the product of step 1 with about 1 mole of 1,4-bis(phenoxy)benzene per mole of oligomer and 4,6-diaminoresorcinol combined and with benzoic acid (a terminator) under conditions such that aromatic electrophilic substitution occurs. The process is described in detail in Harris et al., Copolymers Containing Polybenzoxazole, Polybenzothiazole and Polybenzimidazole Moieties, International Application No. PCT/US89/04464 (filed Oct. 6, 1989), International Publication No. WO 90/03995 (published Apr. 19, 1990) and in U.S. patent application Ser. No. 407,973 (filed Sep. 15, 1989), which are incorporated herein by reference.

The resulting block copolymer composition has the calculated average structure illustrated in Formula 3:

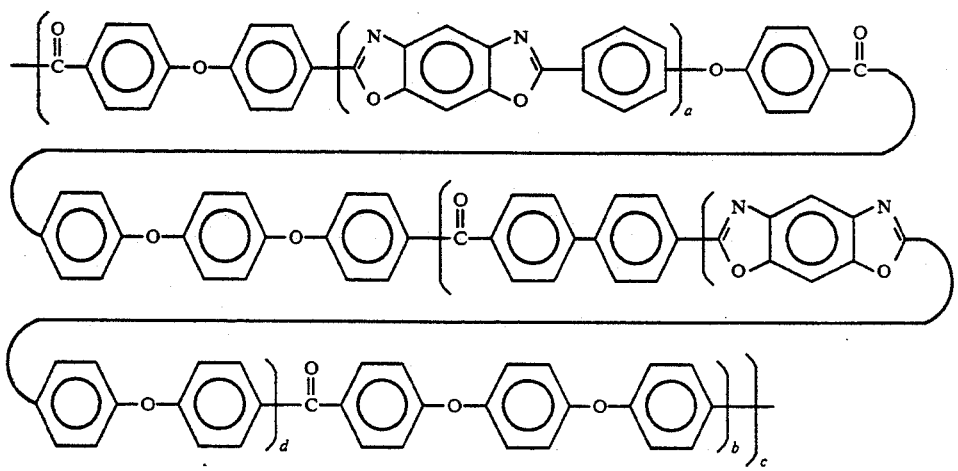

wherein: a is a number of mer units in the rigid rod polybenzazole blocks corresponding on average to the figures provided in Table 3;

b is a number of mer units in the thermoplastic block chosen such that on average the weight ratio of rigid rod polymer to thermoplastic polymer corresponds to the ratio given in Table 3;

c is an number of repeating units such that the block copolymer has on average a molecular weight corresponding to the inherent viscosity in Table 4; and d is number of repeating units within each mer unit of the thermoplastic block which averages about 1.

It contains the percentages of each polymer and has the inherent viscosity shown in Table 3, as measured in methanesulfonic acid at 250° C. and 0.05 g/dL concentration. Its concentration in the dope is between 1 and 15 weight percent. The resulting dopes are optically isotropic (not liquid crystalline).

Each dope is frozen at a temperature between −190° C. and −200° C., and ground to a particle size distribution between about 10μ and 2000μ. The ground frozen dopes are added to an agitated water bath at about room temperature. The resulting precipitated granular compositions are filtered, washed and dried. Some granular compositions are further extracted with acetone or acetyl acetone. They have a particle size distribution between about 10μ and 2000μ.

About 9 grams of each powder is pressed under 20,000 psi pressure at about room temperature for about 10 seconds to form a briquette.

Each briquette is molded at the temperature and pressure shown in Table 3 for the time shown in Table 3 to form a disk having a thickness of about 1/16-inch (0.16 cm) and a diameter of about 2½-inches (6.4 cm). Each disk is tested for flexural strength and modulus by the test described in ASTM D-790. It has the strength, modulus and strain shown in Table 3.

TABLE 3

| Sample | Weight Ratio PBO/PEK-PBO | PBO I.V. (dL/g) | Percent Terminator[2] | Copolymer I.V. (dL/g) | Molding Temp (°C.) | Molding Pressure (ksi)[1] | Molding Time (min) | Flex Modulus (ksi) | Flex Strength (ksi) | Flex Strain (%) |
|---|---|---|---|---|---|---|---|---|---|---|
| 45 | 5/95 | 5.2 | 7 | 4.7 | 390 | 20 | 60 | 534 | 13.5 | 2.5 |
| 46 | 5/95 | 5.2 | 7 | 4.7 | 390 | 2 | 60 | 501 | 10.2 | 2.1 |
| 47 | 5/95 | 5.2 | 7 | 4.7 | 260 | 5 | 60[4] | 528 | 4.1 | 0.8 |
| 48 | 5/95 | 5.2 | 7 | 4.7 | 260 | 5 | 60 | 522 | 4.6 | 0.9 |
| 49 | 5/95 | 5.2 | 9 | 4.3 | 290 | 20 | 5 | 557 | 5.1 | 0.9 |
| 50 | 5/95 | 5.2 | 9 | 4.3 | 340 | 20 | 5 | 553 | 6.6 | 1.2 |
| 51 | 5/95 | 5.2 | 9 | 4.3 | 390 | 20 | 5 | 560 | 7.9 | 1.4 |
| 52 | 5/95 | 5.2 | 9 | 4.3 | 290 | 20 | 60 | 597 | 5.7 | 1.0 |
| 53 | 5/95 | 5.2 | 9 | 4.3 | ⌐390 | 20 | 60 | 531 | 10.5 | 2.0 |
| 54 | 5/95 | 5.1 | * | 3.5 | 390 | 20 | 60 | 594 | 8.0 | 1.3 |
| 55 | 5/95 | 5.1 | * | 12.1 | 225 | 20 | 60 | 160 | 2.0 | 1.8 |
| 56 | 5/95 | 5.1 | * | 12.1 | 290 | 20 | 3 | 290 | 5.1 | 2.4 |
| 57 | 5/95 | 5.1 | * | 12.1 | 340 | 20 | 3 | 338 | 6.9 | 3.2 |
| 58 | 5/95 | 5.1 | * | 12.1 | 390 | 20 | 3 | 454 | 11.1 | 3 |
| 59 | 5/95 | 5.1 | * | 12.1 | 390 | 20 | 60 | 525 | 12.5 | 2.9 |
| 60 | 10/90 | 5.2 | 7 | 6.4 | 390 | 5 | 60 | 624 | 18.6 | 3.1 |
| 61 | 10/90 | 5.2 | 7 | 6.4 | 350 | 5 | 30 | 554 | 11.9 | 2.2 |
| 62 | 10/90 | 5.2 | 9 | 5.7 | 350 | 5 | 10 | 541 | 9.3 | 1.7 |
| 63 | 10/90 | 5.2 | 9 | 5.7 | 400 | 5 | 60 | 699 | 15.1 | 2.2 |
| 64 | 10/90 | 5.2 | 9 | 5.7 | 400 | 5 | 60 | 638 | 13.8 | 2.2 |
| 65 | 10/90 | 5.2 | 11 | 4.5 | 350 | 5 | 30 | 581 | 9.5 | 1.6 |
| 66 | 10/90 | 5.2 | 11 | 4.5 | 400 | 5 | 240 | 645 | 12.4 | 1.9 |
| 67 | 10/90 | 5.2 | 11 | 4.5 | 40 | 5 | 60 | 641 | 14.5 | 2.3 |
| 68 | 10/90 | 4.5 | 11 | 4.9 | 400 | 5 | 60 | 630 | 16.3 | 2.6 |
| 69 | 10/90 | 4.5 | 11 | 4.9 | 400 | 5 | 120 | 673 | 12.3 | 1.9 |
| 70 | 10/90 | 4.5 | 14 | 3.6 | 400 | 5 | 60 | 732 | 13.6 | 1.9 |
| 71 | 10/90 | 4.5 | 14 | 3.6 | 400 | 5 | 60 | 647 | 11.5 | 1.8 |
| 72 | 10/90 | 3.5 | 7 | 5.6 | 390 | 5 | 60 | 562 | 9.3 | 1.8 |
| 73 | 10/90 | 3.5 | 7 | 5.6 | 425 | 5 | 120 | 659 | 12.2 | 1.9 |

TABLE 3-continued

| Sample | Weight Ratio PBO/PEK-PBO | PBO I.V. (dL/g) | Percent Terminator[2] | Copolymer I.V. (dL/g) | Molding Temp (°C.) | Molding Pressure (ksi)[1] | Molding Time (min) | Flex Modulus (ksi) | Flex Strength (ksi) | Flex Strain (%) |
|---|---|---|---|---|---|---|---|---|---|---|
| 74 | 10/90 | 3.5 | 7 | 5.6 | 340 | 5 | 240 | 641 | 7.4 | 1.2 |
| 75 | 10/90 | 3.5 | 9 | 4.9 | 400 | 5 | 60 | 729 | 12.8 | 1.8 |
| 76 | 10/90 | 2.3 | 9 | 4.8 | 425 | 5 | 60 | 664 | 18.9 | 2.9 |
| 77 | 10/90 | 2.3 | 9 | 4.8 | 450 | 5 | 5 | 588 | 7.5 | 1.3 |
| 78 | 10/90 | 2.3 | 9 | 4.8 | 425 | 5 | 120 | 626 | 5.2 | 0.8 |
| 79 | 10/90 | 2.3 | 9 | 4.8 | 425 | 5 | 15 | 621 | 10.0 | 1.6 |
| 80 | 10/90 | 2.3 | 9 | 4.8 | 350 | 5 | 30 | 591 | 10.4 | 1.8 |
| 81[5] | 10/90 | 2.3 | 9 | 4.8 | 350 | 5 | 30 | 470 | 18.6 | 5.0 |
| 82 | 10/90 | 2.3 | 11 | 4.1 | 400 | 5 | 60 | 724 | 15.0 | 2.2 |
| 83 | 10/90 | 2.3 | 11 | 4.1 | 400 | 5 | 60 | 638 | 13.6 | 2.2 |
| 84 | 10/90 | 2.3 | 11 | 4.1 | 400 | 5 | 60 | 640 | 11.5 | 1.8 |
| 85 | 10/90 | 2.0 | 14 | 3.4 | 350 | 5 | 30 | 568 | 6.1 | 1.1 |
| 86 | 10/90 | 2.0 | 14 | 3.4 | 350 | 5 | 3 | 550 | 5.1 | 0.9 |
| 87 | 10/90 | 2.0 | 14 | 3.4 | 350 | 5 | 30[4] | 608 | 4.7 | 0.8 |
| 88 | 10/90 | 2.0 | 14 | 3.4 | 400 | 5 | 65 | 617 | 12.4 | 2 |
| 89 | 10/90 | 2.0 | 14 | 3.4 | 375 | 5 | 420 | 669 | 15.1 | 2.3 |
| 90 | 20/80 | 2 | 9 | 5.4 | | | | | | |

*not measured
[1] 1 ksi = 1000 psi
[2] termination was benzoic acid, using mole percentage relative to diaminorescorcinols
[4] under vacuum
[5] annealed at 350° C. for 960 minutes after molding

EXAMPLE 4

Granular compositions containing a block copolymer of cis-polybenzoxazole and a thermoplastic polybenzoxazole/poly(aromatic ether ketone) copolymer, and molded articles made from them Example 3 is repeated, except that the ratios of 4,6-diaminoresorcinol, oxy-bis-(4-benzoyl chloride) and 1,4-bis-(phenoxy)benzene are adjusted so that the resulting block copolymer is represented by Formula 3, wherein d averages 0.33 (the poly(aromatic ether ketone) content of the thermoplastic block is increased). The results are reported in Table 4.

TABLE 4

| Sample | Weight Ratio PBO/PEK-PBO | PBO I.V. (dL/g) | Percent Terminator[2] | Copolymer I.V. (dL/g) | Molding Temp (°C.) | Molding Pressure (ksi)[1] | Molding Time (min) | Flex Modulus (ksi) | Flex Strength (ksi) | Flex Strain (%) |
|---|---|---|---|---|---|---|---|---|---|---|
| 91 | 10/90 | 4.5 | 16 | 4.2 | 350 | 5 | 60 | 536 | 12.4 | 2.8 |
| 92 | 10/90 | 4.5 | 16 | 4.2 | 350 | 5 | 15 | 600 | 14.8 | 2.4 |
| 93 | 10/90 | 4.5 | 16 | 4.2 | 300 | 5 | 60 | 608 | 9.7 | 1.6 |
| 94 | 10/90 | 4.5 | 16 | 4.2 | 400 | 5 | 60 | 477 | 21.9 | 6.3 |
| 95 | 10/90 | 4.5 | 16 | 4.2 | 350[4] | 5 | 60 | 607 | 14.3 | 2.4 |
| 96 | 10/90 | 4.5 | 16 | 4.2 | 375 | 5 | 5 | 603 | 10.9 | 1.8 |
| 97 | 10/90 | 4.5 | 16 | 4.2 | 350 | 5 | 5 | 612 | 9.7 | 1.6 |
| 98[5] | 10/90 | 4.5 | 16 | 4.2 | 350 | 5 | 5 | 508 | 22.3 | 7.5 |

*not measured
[1] 1 ksi = 1000 psi
[2] terminator was benzoic acid, using mole percentage relative to diaminorescorcinol
[3] sintered at 350° C. for 1245 minutes
[4] under vacuum
[5] annealed at 340° C. for 960 minutes after molding

What is claimed is:

1. A granular composition comprising a block copolymer having polybenzazole polymer blocks and thermoplastic polymer blocks selected such that the block copolymer is thermoplastic and can be compression molded without substantial phase separation, said granular composition having an average particle diameter of no more than about 1000μ.

2. The granular composition of claim 1 wherein the thermoplastic polymer blocks contain a polyamide, a polyimide, a polyquinoxaline, a polyquinoline, a poly(aromatic ether ketone) and/or poly(aromatic ether sulfone), or a copolymer of those polymers with each other and/or polybenzazole.

3. The granular composition of claim 2 wherein the thermoplastic polymer blocks contain an polyamide homopolymer or copolymer.

4. The granular composition of claim 2 wherein the thermoplastic blocks consist essentially of an amorphous polyamide.

5. The granular composition of claim 2 wherein the thermoplastic blocks comprise a poly(aromatic ether ketone or sulfone) homopolymer or copolymer.

6. The granular composition of claim 2 wherein the thermoplastic blocks consists essentially of a poly(aromatic ether ketone or sulfone) homopolymer.

7. The granular composition of claim 2 wherein the granular composition consists essentially of a thermoplastic block copolymer containing polybenzazole blocks and poly(aromatic ether ketone or sulfone) blocks.

8. The granular composition of claim 1 wherein each polybenzazole polymer block contains on average between about 5 and about 150 mer units.

9. The granular composition of claim 8 wherein the polybenzazole polymer blocks contain AB-PBZ mer units which are each individually represented by the Formula:

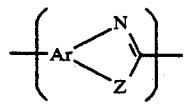

wherein Ar is an aromatic group and Z is an oxygen atom or a sulfur atom.

10. The granular composition of claim 8 wherein the polybenzazole polymer blocks contain AA/BB-PBZ mer units which are each individually represented by the Formula:

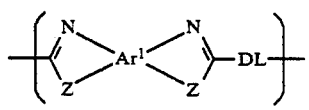

wherein Ar' is an aromatic group; DL is a divalent linking moiety chosen such that it does not interfere with the synthesis, fabrication or use of the polymer; and Z is an oxygen atom or a sulfur atom.

11. The granular composition of claim 8 wherein the polybenzazole polymer blocks are rigid rod polymers.

12. The granular composition of claim 1 wherein the ratio of polybenzazole polymer to theromplastic polymer is between 1/99 and 70/30 by inclusive weight.

13. The granular composition of claim 12 wherein the ratio of polybenzazole polymer to thermoplastic polymer is no more than about 30/70 by weight.

14. The granular composition of claim 1 wherein the average particle size of the composition is between about 1μ and about 250μ.

15. A briquette containing a granular composition of claim 1.

16. A briquette containing a granular composition of claim 2.

17. A briquette containing a granular composition of claim 11.

18. A briquette containing a granular composition of claim 12.

19. A granular composition comprising a block copolymer having polybenzazole polymer blocks and thermoplastic polymer blocks selected such that the block copolymer is flowable at a temperature below its decomposition temperature, wherein said granular composition has an average particle diameter of no more than about 1000μ.

20. The granular composition of claim 19 wherein the thermoplastic copolymer blocks contain a polyamide, a polyimide, apolyquinoxaline, a polyquinoline, a poly(ether ketone and/or sulfone), or a copolymer of those polymers which each other and/or polybenzazole.

21. The granular composition of claim 20 wherein the thermoplastic polymer blocks contain an polyamide homopolymer or copolymer.

22. The granular composition of claim 20 wherein the thermoplastic blocks consist essentially of an amorphous polyamide.

23. The granular composition of claim 20 wherein the thermoplastic blocks comprise a poly(aromatic ether ketone or sulfone) homopolymer or copolymer.

24. The granular composition of claim 20 wherein the thermoplastic blocks consists essentially of a poly(aromatic ether ketone or sulfone) homopolymer.

25. The granular composition of claim 20 wherein the granular composition consists essentially of a thermoplastic block copolymer containing polybenzazole blocks and poly(aromatic ether ketone or sulfone) blocks.

26. The granular composition of claim 19 wherein each polybenzazole polymer block contains on average between about 5 and about 150 mer units.

27. The granular composition of claim 26 wherein the polybenzazole polymer blocks contain AB-PBZ mer units which are each individually represented by the Formula:

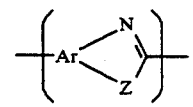

wherein Ar is an aromatic group and Z is an oxygen atom or a sulfur atom.

28. The granular composition of claim 26 wherein the polybenzazole polymer blocks contain AA/BB-PBZ mer units which are each individually represented by the Formula:

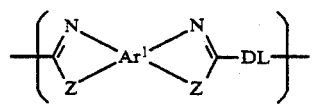

wherein Ar' is an aromatic group; DL is a divalent linking moiety chosen such that it does not interfere with the synthesis, fabrication or use of the polymer; and Z is an oxygen atom or a sulfur atom.

29. The granular composition of claim 26 wherein the polybenzazole polymer blocks are rigid rod polymers.

30. The granular composition of claim 19 wherein the ratio of polybenzazole polymer to thermo-plastic polymer is between 1/99 and 70/30 by inclusive weight.

31. The granular composition of claim 30 wherein the ratio of polybenzazole polymer to thermoplastic polymer is no more than about 30/70 by weight.

32. The granular composition of claim 19 wherein the average particle size of the composition is no more than about 100μ.

33. A briquette containing a granular composition of claim 19.

34. A briquette containing a granular composition of claim 20.

35. A briquette containing a granular composition of claim 29.

36. A briquette containing a granular composition of claim 30.

37. A block copolymer comprising:
(a) at least one polybenzazole block containing on average at least about 5 mer units and less than 10 mer units; and
(b) at least one thermoplastic block linked to said polybenzazole block
selected such that the block copolymer becomes flowable at a temperature at which it does not substantially decompose.

38. The block copolymer of claim 37 wherein the polybenzazole block contains polybenzoxazole or polybenzothiazole mer units.

39. The block copolymer of claim 38 wherein the polybenzazole block contains AB-PBZ mer units which are each individually represented by the Formula:

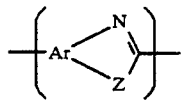

wherein A is an aromatic group and Z is an oxygen atom or a sulfur atom.

40. The block copolymer of claim 38 wherein the polybenzazole block contains AA/BB-PBZ mer units which are each individually represented by the Formula:

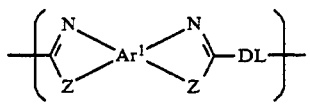

wherein Ar' is an aromatic group; DL is a divalent linking moiety chosen such that it does not interfere with the synthesis, fabrication or use of the polymer; and Z is an oxygen atom or a sulfur atom.

41. The block copolymer of claim 38 wherein the polybenzazole block contains a rigid rod polymer.

42. The block copolymer of claim 38 wherein the thermoplastic block is a thermoplastic polyamide polymer or copolymer.

43. The block copolymer of claim 38 wherein the thermoplastic block is a thermoplastic polyimide polymer of copolymer.

44. The block copolymer of claim 38 wherein the thermoplastic block is a thermoplastic polyquinoline polymer or copolymer.

45. The block copolymer of claim 38 wherein the thermoplastic block is a thermoplastic polyquinoxaline polymer or copolymer.

46. The block copolymer of claim 38 wherein the thermoplastic block is thermoplastic poly(aromatic ether ketone) or poly(aromatic ether sulfone) polymer or copolymer.

47. The block copolymer of claim 46 wherein the thermoplastic poly(aromatic ether ketone) or poly(aromatic ether sulfone) is a copolymer with polybenzazole.

48. The block copolymer of claim 38 wherein the average formula weight of each thermoplastic block is at least about 800.

49. The block copolymer of claim 38 wherein the block copolymer contains an average at least about 5 weight percent polybenzazole block and at least about 10 weight percent thermoplastic block.

50. A molded article comprising a block copolymer having polybenzazole polymer blocks and thermoplastic polymer blocks, wherein said block copolymer is not substantially phase separated.

51. The molded article of claim 50 wherein:
(a) the polybenzazole block make up at least about 5 weight percent of the block copolymer and consist essentially of polybenzoxazole, polybenzothiazole or a copolymer thereof; and
(b) the thermoplastic blocks make up at least about 10 weight percent of the block copolymer and consist essentially of polyamide, poly(aromatic ether ketone), poly(aromatic ether sulfone), or a copolymer of those polymers with each other or polybenzazole.

52. The molded article of claim 51 wherein the polymer is planar isotropic.

53. The molded article of claim 51 wherein the polymer is isotropic in all three dimensions.

54. The molded article of claim 53 wherein the molded article is at least about ⅛-inch thick.

55. A process for molding a shaped article comprising the step of molding a granular composition, containing a block copolymer having polybenzazole polymer blocks and thermoplastic polymer blocks selected such that the block copolymer is thermoplastic and can be compression molded without substantial phase separation, in a mold at a temperature at which the granular composition is flowable and a pressure sufficient to cause the granular composition to consolidate and conform to the shape of the mold.

56. The process of claim 55 wherein:
(a) the polybenzazole blocks make up at least about 5 weight percent of the block copolymer and consist essentially of polybenzoxazole, polybenzothiazole or a copolymer thereof; and
(b) the thermoplastic blocks make up at least about 10 weight percent of the block copolymer and consist essentially of polyamide, poly(aromatic ether ketone), poly(aromatic ether sulfone), or a copolymer of those polymers with each other or polybenzazole.

57. The process of claim 56 wherein the temperature of molding is at least about 5° C. above the glass-transition temperature of the block copolymer.

58. The process of claim 56 wherein the pressure of molding is between 500 and 50,000 psi.

59. The process of claim 56 further comprising the step of annealing the molded product at a temperature above its glass-transition and below its melting point.

60. The process of claim 56 wherein the molded product is at least about ⅛ inch thick.

61. A process for molding a shaped article comprising the step of molding a granular composition, containing a block copolymer having polybenzazole polymer blocks and thermoplastic polymer blocks selected such that the block copolymer is flowable at a temperature below its decomposition temperature, in a mold at a temperature at which the granular composition is flowable and a pressure sufficient to cause the granular composition to consolidate and conform to the shape of the mold.

62. The process of claim 61 wherein:
(a) the polybenzazole blocks make up at least about 5 weight percent of the block copolymer and consist essentially of polybenzoxazole, polybenzothiazole or a copolymer thereof; and
(b) the thermoplastic blocks make up at least about 10 weight percent of the block copolymer and consist essentially of polyamide, poly(aromatic ether ketone), poly(aromatic ether sulfone), or a copolymer of those polymers with each other or polybenzazole.

63. The process of claim 62 wherein the temperature of molding is at least about 5° C. above the glass-transition temperature of the block copolymer.

64. The process of claim 62 wherein the pressure of molding is between 500 and 50,000 psi.

65. The process of claim 62 further comprising the step of annealing the molded product at a temperature above its glass-transition and below its melting point.

66. The process of claim 62 wherein the molded product is at least about ⅛ inch thick.

* * * * *